United States Patent [19]
Capasso et al.

[11] Patent Number: 5,745,516
[45] Date of Patent: Apr. 28, 1998

[54] ARTICLE COMPRISING A UNIPOLAR SUPERLATTICE LASER

[75] Inventors: Federico Capasso, Westfield; Alfred Yi Cho, Summit; Jerome Faist, Scotch Plains; Albert Lee Hutchinson, Piscataway, all of N.J.; Gaetano Scamarcio, Bari, Italy; Carlo Sirtori, Summit; Deborah Lee Sivco, Warren, both of N.J.

[73] Assignee: Lucent Technologies Inc., Murray Hill, N.J.

[21] Appl. No.: 744,292

[22] Filed: Nov. 6, 1996

[51] Int. Cl.⁶ .................................................... H01S 3/19
[52] U.S. Cl. .................................................... 372/45
[58] Field of Search ............................ 372/45, 44, 46

[56] References Cited

U.S. PATENT DOCUMENTS 5,570,386 10/1996 Capasso et al. ......................... 372/45

OTHER PUBLICATIONS

Patent No. 5,457,709, filed on Apr. 4, 1994 and issued on Oct. 10, 1995 to F. Capasso et al., Class: 372/45.
Patent No. 5,509,025, filed on Jan. 9, 1995 and issued on Apr. 16, 1996 to F. Capasso et al., Class: 372/45.
Patent 5,502,787, filed on May 22, 1995 and issued on Mar. 26, 1996 to F. Capasso et al., Class: 385/123.

"High Power Mid–infrared ($\lambda \sim 5$ μm) Quantum Cascade Lasers Operating Above Room Temperature", by J. Faist, *Applied Physics Letters*, vol. 68(26), 24 Jun. 1996, pp. 3680–3682.

*Primary Examiner*—James W. Davie
*Attorney, Agent, or Firm*—Eugen E. Pacher

[57] ABSTRACT

The novel unipolar laser resembles a quantum cascade laser but utilizes radiative transitions between upper and lower minibands of superlattices, with injection of charge carriers from the lower miniband into the upper miniband of the adjacent downstream superlattice facilitated by a multilayer injector region. The lasing wavelength is typically in the mid-infrared, selectable by choice of the superlattice parameters. The novel laser is potentially well suited for high power operation, since it utilizes carrier transport in minibands, as opposed to tunneling between discrete energy states.

6 Claims, 2 Drawing Sheets

ARTICLE COMPRISING A UNIPOLAR SUPERLATTICE LASER

FIELD OF THE INVENTION

This application pertains to semiconductor lasers, more specifically, to unipolar semiconductor lasers.

BACKGROUND

Recently a new type of semiconductor lasers (named "quantum cascade" laser) was discovered. Quantum cascade (QC) lasers are unipolar, and comprise a multiplicity of active regions, with a multilayer injector/relaxation region between any two adjacent active regions. See, for instance, U.S. Pat. Nos. 5,457,709 and 5,509,025, as well as J. Faist et al, *Applied Physics Letters*, Vol. 68, p. 3680 (1996), all incorporated herein by reference.

In QC lasers an active region comprises one or more quantum wells selected to facilitate charge carrier radiative transitions from an upper to a lower energy state. In one embodiment the transition is "diagonal", i.e. from an upper energy state in one quantum well to a lower state in an adjacent (downstream) quantum well. In another embodiment the transition is "vertical", i.e. from an upper energy state in a quantum well to a lower energy state in essentially the same quantum well. Charge carrier injection into the upper energy state from the lower energy state of the adjacent (upstream) active region is facilitated by the injector/relaxation region between the two active regions.

The transition from the upper to the lower energy state results in emission of a photon of wavelength $\lambda$. The wavelength depends not only on the compositions of the quantum wells (and barriers) in the active regions but also on the layer thicknesses. The wavelength thus is under the direct control of the device designer. The wavelength frequently is in the approximate range 4–12 µm, a regime in which few other radiation sources exist. It is also a regime that is useful for e.g., gas/vapor monitoring, and QC lasers are advantageously incorporated into gas/vapor sensing equipment, e.g., pollution monitoring equipment.

In order to provide the practitioner with still more design freedom, it would be desirable to have available other lasers that can emit radiation in the mid-infrared (e.g., 4–12 µm) wavelength regime, especially if the design is potentially suited for high power operations. This application discloses such a laser.

SUMMARY OF THE INVENTION

The invention is embodied in an article that comprises a unipolar semiconductor laser having a core region disposed between a lower and an upper cladding region, with contacts provided for causing a current to flow through the laser. The core region comprises a multiplicity of, typically also essentially identical, superlattice active regions and a multiplicity of, typically essentially identical, multilayer injector regions, with an injector region disposed between any two adjacent active regions. The active regions are selected to have an upper and a lower conduction miniband, and such that charge carriers can undergo a transition from the upper to the lower miniband, with emission of a photon of energy corresponding substantially to the minimum energy difference $E_{mg}$ between the upper and lower conduction minibands. The injector regions are selected such that, under appropriate bias, charge carriers can pass from the lower conduction miniband of a given active region through the adjacent injector to the upper conduction miniband of the adjacent (downstream) active region.

More specifically, the invention is embodied in an article (e.g., a gas/vapor sensor) that comprises a unipolar semiconductor laser. The laser comprises, in sequence, an upper cladding region, a core region, and a lower cladding region. It also comprises contacts for applying an electrical bias to the laser. The core region comprises a multiplicity of active regions and injector regions, respectively, with an injector region disposed between any two adjacent active regions. The active regions are selected to facilitate radiative carrier transition from an upper to a lower energy state resulting in emission of a photon, and the injector regions are selected to facilitate, under appropriate electrical bias, charge carrier passage from the lower energy state of a given active region to the upper energy state of an immediately adjacent downstream active region.

Significantly, the given active region comprises a superlattice that comprises alternating quantum wells and barriers of thickness $t_w$ and $t_b$, respectively, with the quantum wells and barriers selected such that the given active region has an upper and a lower conduction miniband, with a minimum energy gap $E_{mg}$ between the upper and lower minibands, (this energy gap to be referred to as the "minigap") where $E_{mg}$ is substantially equal to the energy of said emitted photon, and with the radiative carrier transition being from the upper to the lower conduction miniband.

Those skilled in the art will recognize that the instant laser differs from prior art QC lasers inter alia with respect to the nature of the active regions, and consequently of the energy states. In the former the active regions comprise doped uniform superlattices, and the carrier transitions are from an upper conduction miniband to a lower conduction miniband. On the other hand, in the latter the active regions are undoped, typically each containing a relatively small (e.g., 1–3) number of quantum wells so that minibands are not formed, and the carrier transitions are from an upper energy state of a predetermined quantum well to a lower energy state of the same or another predetermined quantum well.

Lasers according to this invention utilize carrier transport in minibands. Such transport typically is better adapted for high current flow through the laser than is, for instance, transport involving tunneling between discrete energy states. Thus, lasers according to the invention are potentially well suited for high power operation.

DETAILED DESCRIPTION

Figure 1:
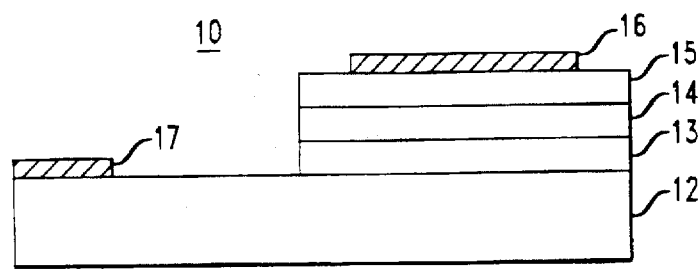
FIG. 1 schematically depicts an exemplary laser according to the invention.

FIG. 1 schematically depicts an exemplary laser 10 according to the invention, wherein numerals 16 and 17 refer to metal contacts, and numerals 12–15 refer, respectively, to the substrate/lower waveguide cladding, waveguide core, upper waveguide cladding, and contact layer.

Tables I–IV show the layer structure in greater detail. The $n^+$ InP substrate serves as the lower waveguide cladding. The semiconductor layers that are disposed on the $n^+$ substrate are essentially lattice matched to InP. For instance, each of the 25 superlattices consists of a multiplicity of $Ga_{0.47}In_{0.53}As$ quantum wells and $Al_{0.48}In_{0.52}As$ barrier layers.

It will be noted from Tables I–IV that, at least in the instant exemplary embodiment, all layers are doped. In the exemplary structure the doping is n-type.

Details of the layers designated "Digital I" (pertaining to the injector) and "Digital II" in Table I are shown in Tables II and III, respectively, and details of the superlattice layer are shown in Table IV. It should be noted that the superlattice structure of Table IV and the Digital I (injector) structure of Table II are repeated a number of times, exemplarily 25 times. The exemplary layer structure of Tables I–IV provides efficient guiding for the laser radiation, with computed confinement factor 0.6. The waveguide structure was designed to provide plasmon-assisted guiding, substantially as taught in U.S. Pat. No. 5,502,787.

TABLE I

| Layer | Doping | Thickness (nm) | Region |
|---|---|---|---|
| GaInAs, Sn doped | $n = 1.0 \times 10^{20}$ cm$^{-3}$ | 20.0 nm | Contact layer |
| GaInAs | $8.0 \times 10^{18}$ | 600.0 | ↑ |
| AlGaInAs, Graded | $5.0 \times 10^{17}$ | 40.0 | |
| AlInAs | $5.0 \times 10^{17}$ | 20.0 | |
| AlInAs | $3.0 \times 10^{17}$ | 1200.0 | Waveguide cladding |
| AlInAs | $1.2 \times 10^{17}$ | 1200.0 | |
| AlInAs | $1.0 \times 10^{18}$ | 10.0 | ↓ |
| AlGaInAs, Graded | $1.0 \times 10^{17}$ | 40.0 | |
| GaInAs | $1.0 \times 10^{17}$ | 40.0 | ↑ |
| DIGITAL I | $1.0 \times 10^{17}$ | 42.5 | ↓ Waveguide core |
| GaInAs/AlInAs Superlattice | $1.0 \times 10^{17}$ | 43.4 × 25 | |
| | | 25 | ↑ |
| GaInAs | $6.0 \times 10^{16}$ | 400.0 | |
| DIGITAL II | $1.0 \times 10^{17}$ | 25.0 | ↓ |
| Doped n+ | | InP substrate | Waveguide cladding |

TABLE II

| Digital I | total thickness = 42.5 nm | $n = 1.0 \times 10^{17}$ |
|---|---|---|
| 3.6 nm | GaInAs | n |
| 1.7 | AlInAs | n |
| 3.3 | GaInAs | n |
| 2.0 | AlInAs | n |
| 3.0 | GaInAs | n |
| 2.3 | AlInAs | n |
| 2.6 | GaInAs | n |
| 2.7 | AlInAs | n |
| 2.2 | GaInAs | n |
| 3.1 | AlInAs | n |
| 1.9 | GaInAs | n |
| 3.4 | AlInAs | n |
| 1.6 | GaInAs | n |
| 3.7 | AlInAs | n |
| 1.4 | GaInAs | n |
| 4.0 | AlInAs | n |

TABLE III

| Digital II: | total thickness 25.0 nm | |
|---|---|---|
| 0.5 nm | AlInAs | $n = 1 \times 10^{17}$ |
| 4.5 | GaInAs | n |
| 1.0 | AlInAs | n |
| 4.0 | GaInAs | n |
| 1.5 | AlInAs | n |
| 3.5 | GaInAs | n |
| 2.0 | AlInAs | n |
| 3.0 | GaInAs | n |

TABLE III-continued

| Digital II: | total thickness 25.0 nm | |
|---|---|---|
| 2.5 | AlInAs | n |
| 2.5 | GaInAs | n |

TABLE IV

| SUPERLATTICE | | | | |
|---|---|---|---|---|
| 4.3 nm | GaInAs | $n = 1.0 \times 10^{17}$ | } | × 7 |
| 1.0 nm | AlInAs | n | | |
| 4.3 nm | GaInAs | n | | |
| 2.0 nm | AlInAs | n | | |

Figure 2:
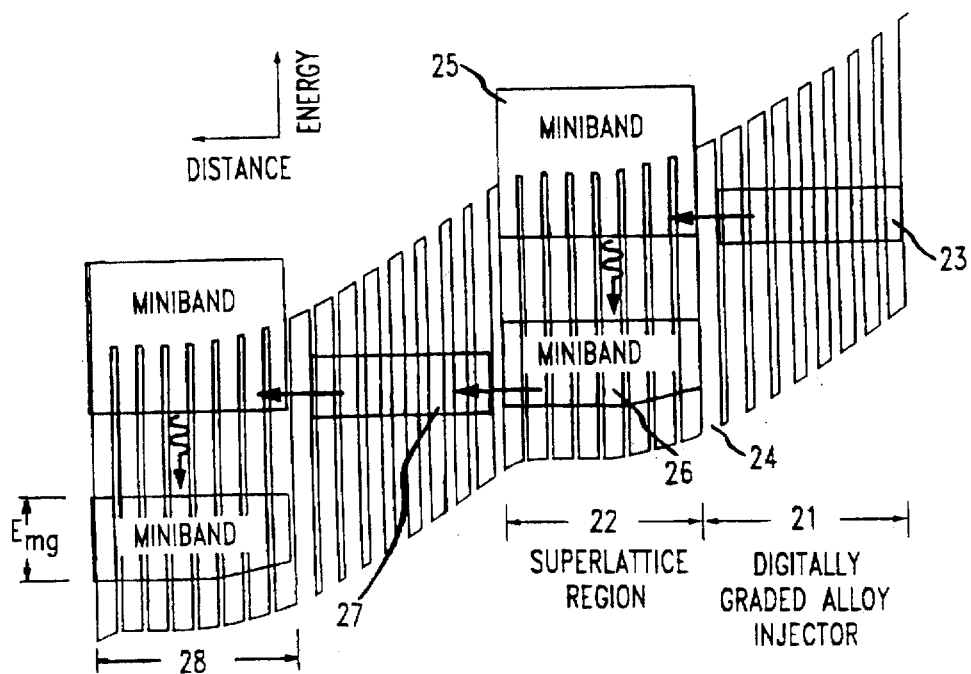
FIG. 2 shows a relevant portion of the conduction band edge of a (biased) laser according to the invention.

FIG. 2 schematically illustrates the mode of operation of lasers according to this invention. Charge carriers (typically electrons) from the adjacent upstream superlattice region (not shown) are transmitted through transmission window 23 of injector 21 in conventional fashion and tunnel through barrier layer 24 into upper (excited) miniband 25, where the carriers typically relax in a time $\leq 1$ ps via intraminiband optical phonon emission to the lowest energy levels of the excited miniband. At least a substantial fraction of the carriers then undergoes a radiative transition from the bottom of the upper miniband to the top of the lower miniband 26. This transition is characterized by a longer scattering time than the intra-miniband scattering time because of the larger momentum transfer involved in the former. Under appropriate bias, charge carriers are then transmitted from lower miniband 26 through adjacent downstream injector 27 to the upper miniband of the adjacent downstream superlattice 28, to repeat the process of radiative transition between minibands. These transitions occur primarily at the Brillouin zone boundary where the gap width is minimum, not only for the above-indicated reasons but also because the oscillator strength of these interband transitions increases with increasing $k_z$, being a maximum at the superlattice Brillouin zone boundary.

A significant feature of lasers according to the invention is the doping of the superlattice regions. The doping is selected to reduce electric field penetration and to suppress space charge effects at a predetermined bias level, thus minimizing field induced localization effects and domain formation. Furthermore, the doping is selected such that the quasi-Fermi level $E_{Fn}$ is well below the maximum energy of the lower miniband, in order to ensure the presence of holes at and near the maximum of the lower miniband. Exemplarily, the doping is selected such that $E_{Fn}$ is in the approximate range 15 meV to $\Delta/2$, where $\Delta$ is the energy width of the lower miniband.

Population inversion is readily attained in the above described structure. Lifetime for carriers at the energy minimum of the upper miniband is about 1 ps, significantly longer than the intra-band lifetime in the lower miniband (~0.2 ps). The structure thus readily meets the inversion condition that the lifetime in the relevant excited state is greater than the lifetime in the final state of the radiative transition. The bias typically is selected such that the conduction band in the injector regions is substantially flat.

The injector regions desirably also serve as Bragg reflectors for carriers injected into the upper miniband of the respective adjacent upstream superlattice region, thus increasing the radiative efficiency.

Figure 4:
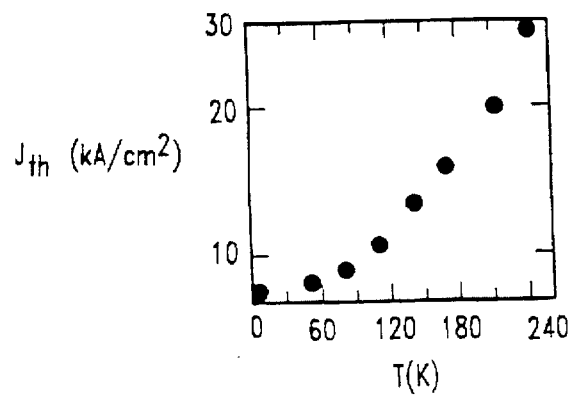
FIGS. 3–5 show experimental pulse data for an exemplary laser according to the invention.
Figure 3:
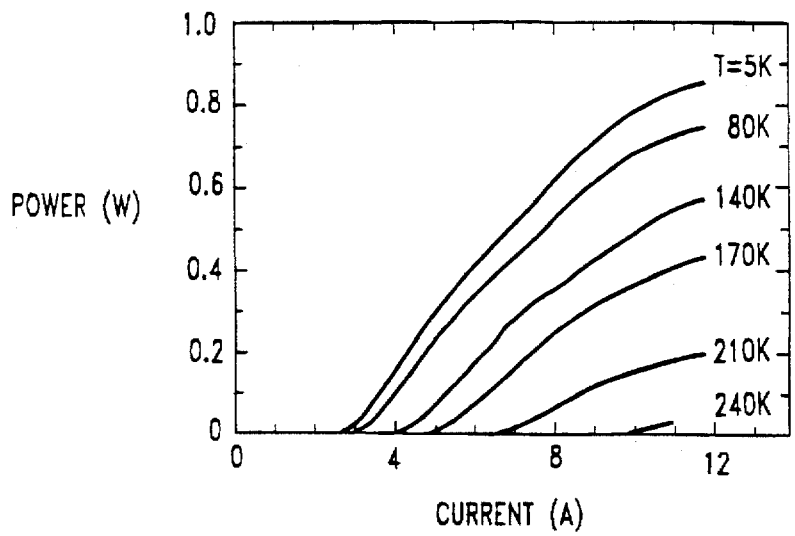
Figure 5:
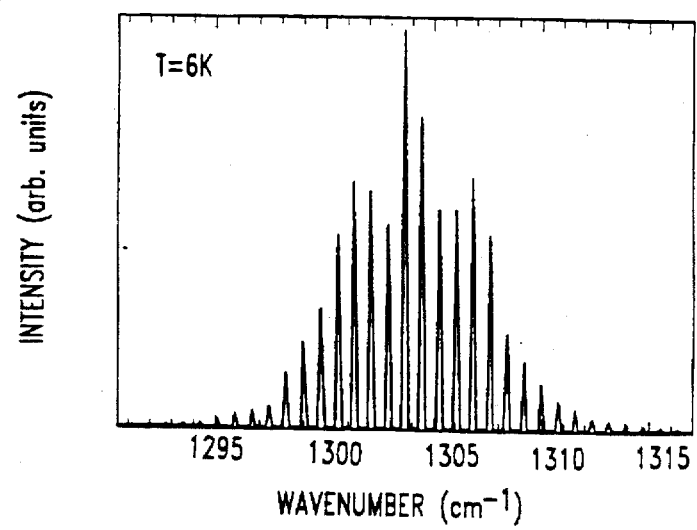

FIG. 3 shows data on peak optical pulse power as a function of current through a laser according to the invention, having the above recited structure (with 1.9 mm cavity length), and FIG. 4 shows data on the temperature dependence of the threshold current of the laser. FIG. 5 shows exemplary data of optical intensity vs. wave number of the laser. The data clearly show that the device functions as a laser, with wavelength about 7.7 μm. The data of FIGS. 3-5 pertains to pulse operation. By way of example, at 5K, the current of 11 amp resulted when a voltage of 9 V was applied.

Figure 6:
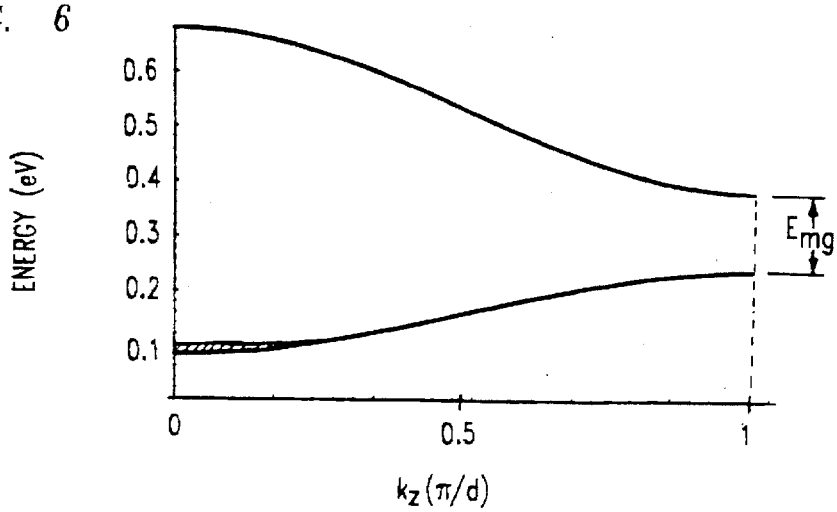
FIG. 6 shows the computed dispersion of the minibands of the laser according to the invention.

FIG. 6 shows the (computed) wave vector-dependence (dispersion) of the lower and upper band edge of the upper and lower minibands, respectively, of the above described laser according to the invention. As can be seen, the minimum energy gap $E_{mg}$ of about 157 meV occurs at the superlattice Brillouin zone boundary (located at $k_z=\pi/d$, where d is the superlattice periodicity). This energy difference corresponds to a photon wavelength $\lambda=7.9$ μm, in good agreement with the observed emission wavelength of the exemplary laser. The doping of the superlattice regions of the laser resulted in $E_{Fn}$~20 meV, schematically indicated in FIG. 6.

The emission wavelength can be readily selected by design of the structure. For instance, we have made two preliminary (non-lasing) devices that differed from each other primarily with regard to the superlattices. One device had 5 superlattice regions, each superlattice consisting of nine AlInAs (1.8 nm)/GaInAs (6 nm) periods, uniformly doped with Si to $n=6\times10^{16}$ cm$^{-3}$, corresponding to quasi-Fermi level $E_{Fn}=12$ meV. The other device had the same numbers of superlattice regions and periods, but barrier and quantum well thicknesses were 2.6 nm and 4 nm, respectively, to provide a larger energy gap between the minibands. The doping level in the superlattices of the latter device was $7\times10^{16}$ cm$^{-3}$ to provide the same $E_{Fn}$ as in the former.

The dispersion of the energy bands of the above described superlattices was calculated. The minigap between the two lowest conduction minibands was found to be 161.5 meV and 251 meV, respectively. These devices were tested, and were found to have a strong luminescence peak at about 175 meV and 250 meV, respectively, corresponding to wavelengths 7.1 and 5 μm, respectively.

The invention was demonstrated by means of an exemplary GaInAs/AlInAs structure. Of course, the invention is not thus limited, and can, at least in principle, be embodied in any material systems that allows for formation of appropriate superlattices in an appropriate waveguide structure. Exemplary further material systems are AlGaAs/GaAs, InP/GaInAs, and InAs/GaInSb.

The invention claimed is:

1. An article comprising a unipolar semiconductor laser comprising, in sequence, an upper cladding region, a core region, and a lower cladding region, and further comprising contacts for electrically contacting the laser, said core region comprising a multiplicity of active regions and injector regions, respectively, with an injector region disposed between any two adjacent active regions, the active regions selected to facilitate radiative carrier transition from an upper to a lower energy state resulting in emission of a photon of energy hv, where h is Planck's constant and v is the photon frequency, and the injector regions selected to facilitate, under appropriate electrical bias, charge carrier passage from the lower energy state of a given active region to the upper energy state of the immediately adjacent downstream active region;

CHARACTERIZED IN THAT the given active region comprises a doped superlattice comprising alternating quantum wells and barriers, with the quantum wells being of thickness $t_w$, and the barriers being of thickness $t_b$, with the superlattice selected such that the given active region has an upper and a lower conduction miniband, with a minimum energy difference $E_{mg}$ between the upper and lower minibands, with the radiative carrier transition being from the upper to the lower mini-band with hv being substantially equal to $E_{mg}$.

2. Article according to claim 1, wherein the photon frequency v is in the mid-infrared region of the electromagnetic spectrum.

3. Article according to claim 2, wherein the photon frequency corresponds to a wavelength in the range 4–12 μm.

4. Article according to claim 1, wherein the doping of the superlattice is selected to result in a quasi-Fermi energy $E_{Fn}$ in the range 15 meV–$\Delta/2$, where $\Delta$ is the energy width of the lower miniband.

5. Article according to claim 1, wherein the doping is n-type doping.

6. Article according to claim 1, wherein the superlattice region comprises alternating layers selected from the group of pairs consisting of GaInAs/AlInAs, AlGaAs/GaAs, InP/GaInAs, and InAs/GaInSb.

* * * * *